United States Patent [19]

Tanaka et al.

[11] 3,813,764

[45] June 4, 1974

[54] METHOD OF PRODUCING LAMINATED PANCAKE TYPE SUPERCONDUCTIVE MAGNETS

[75] Inventors: Eihachiro Tanaka; Yutaka Onodera, both of Sendai; Takeji Fukuda, Kanuma; Tsutomu Yamashita, Sendai; Shoji Kuma, Hitachi, all of Japan

[73] Assignee: The Research Institute for Iron Steel and Other Metals, Sendai City, Japan

[22] Filed: Jan. 18, 1971

[21] Appl. No.: 107,467

Related U.S. Application Data

[62] Division of Ser. No. 10,971, Feb. 12, 1970, Pat. No. 3,652,967.

[30] Foreign Application Priority Data

June 9, 1969 Japan ............................... 44-44615

[52] U.S. Cl. ...................... 29/599, 29/194, 29/417, 174/126 CP, 174/DIG. 6, 335/216

[51] Int. Cl. ........................................... H01v 11/14

[58] Field of Search ........ 29/599, 194; 174/126 CP, 174/DIG. 6; 335/216

[56] References Cited

UNITED STATES PATENTS

| | | | |
|---|---|---|---|
| 3,310,862 | 3/1967 | Allen | 29/599 |
| 3,397,084 | 8/1968 | Krieglstein | 29/194 X |
| 3,665,595 | 10/1969 | Tanaka et al. | 29/599 |
| 3,570,118 | 3/1971 | Reynolds et al. | 29/599 |
| 3,574,573 | 4/1971 | Tachikawa et al. | 29/194 X |
| 3,625,662 | 12/1971 | Roberts et al. | 29/599 X |

*Primary Examiner*—Charles W. Lanham
*Assistant Examiner*—D. C. Reiley, III
*Attorney, Agent, or Firm*—Sughrue, Rothwell, Mion, Zinn & Macpeak

[57] ABSTRACT

A superconductive magnet comprises superconductive coiled layers; diffusion shielding coiled layers, between which the superconductive coiled layer is put; stabilizing conductor coiled layers, between which the diffusion shielding coiled layer is put; and a normal conductor acting as a superconductive insulation between the superconductive coiled layers. Said superconductive magnet is produced by laminating thin sheets of metal or alloy to constitute the superconductive material in such a ratio that a superconductive alloy or intermetallic compound is formed, superposing thin sheets of metal or alloy shielding diffusion against the former thin sheets and thin sheets of metal or alloy stabilizing the superconductivity on both the surfaces of the laminated sheets respectively, coiling the formed sheets on a core sheath in multilayer, covering the resulting coiled body with an outer sheath, subjecting the assembly to a diameter reducing treatment to adhere the layers and heating the adhered layers until the superconductive alloy or intermetallic compound is formed.

7 Claims, 6 Drawing Figures

METHOD OF PRODUCING LAMINATED PANCAKE TYPE SUPERCONDUCTIVE MAGNETS

The present application is a divisional application of Ser. No. 10,971, filed on Feb. 12, 1970, claiming priority based upon Japanese application Ser. No. 44,615/69.

The present invention relates to a superconductive magnet and method of producing the same.

Several years ago, production of superconductive magnets of 60 K Oe was accomplished and since then superconductive magnets have been mainly used as magnets for producing high magnetic fields.

Conventional production of a superconductive magnet requires a very complicated process. Namely, a superconductive cable stabilized by a large amount of copper was wound in multilayers on a frame made of stainless steel and the like and having a high mechanical strength under a tension of 2 to 3 kg while applying an insulation in the form of a Mylar sheet or the like, and this process was very laborious.

Furthermore, the above described superconductive cable itself requires considerably complicated steps for the production thereof, and therefore the production of the superconductive magnet required a large amount of labor and time.

As mentioned above, superconductive magnets were previously produced only in laboratory work and have not been suited to mass production, and, further, the resulting product has been poor in mechanical strength and stability. Moreover, a large amount of stabilizing metal is used, and consequently the magnet itself becomes massive and therefore requires an unnecessarily large amount of liquid helium.

Another defect of the prior art was the laborious requirement for, the insertion of a layer of insulating material, such as Mylar, between the copper layers.

The present invention provides a superconductive magnet in which a normal conductor can be used as an insulating material by utilizing the fact that the specific resistance of the normal conductor, that is a conductive material used at room temperature, is $10^{-4} - 10^{-11}$ Ωcm, and this resistance is very much larger than the specific resistance of superconductive material which is less that $10^{-24}$ Ωcm.

The superconductive magnet is produced by merely combining metal materials as mentioned hereinafter and a particularly compact superconductive magnet can be easily produced due to adhesivity between mutual metals. Furthermore, the present invention has the following merits: the thermal conductivity and the mechanical strength are very high, and the processability is so superior that mass production of a superconductive magnet can be effected.

For a better understanding of the invention, reference is made to the accompanying drawings, wherein:

FIG. 1*a* is a cros-sectional view of an embodiment of a superconductive magnet of the present invention;

FIG. 1*b* is a detailed view of a part of the superconductive coil of the magnet shown in FIG. 1*a;*

Figure 1A:
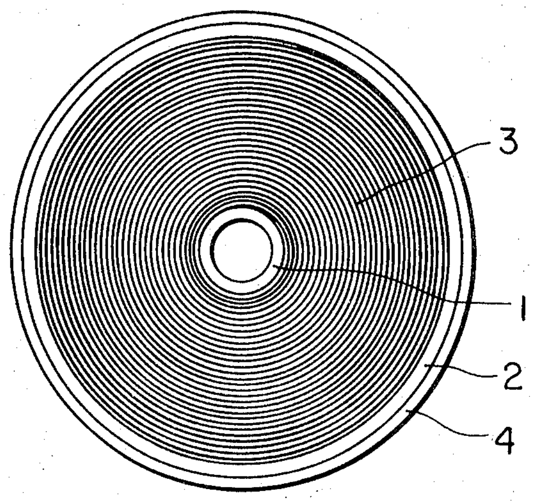

As mentioned above, FIG. 1*a* shows a cross-section of the superconductive magnet according to the present invention and 1 and 2 are copper pipes of inner and outer sheaths respectively, 3 is a superconductive coil, 4 is a reinforcing outer case having a high mechanical strength such as stainless steel.

Figure 1B:
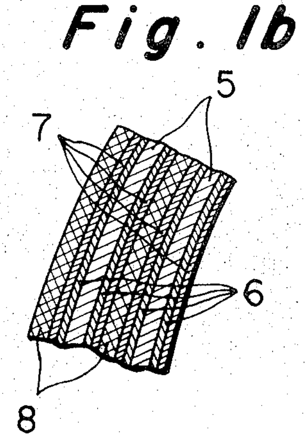

FIG. 1*b* shows the superconductive coil 3 in detail and 5 is a superconductive coiled layer, 6 is a diffusion shielding layer, 7 is a stabilizing conductor coiled layer and 8 is an insulating coiled layer composed of metal, alloy or an intermetallic compound having a high resistance, and which provides insulation between the superconductive layers.

The superconductive coiled layer 3 is composed of a superconductive alloy or intermetallic compound layer formed by laminating metallic thin sheets of elements of superconductive material, such as Nb, Sn, Al, V, Zr, Ti, Pb, Ge and the like, or a thin sheet of an alloy of these elements in such a combination that said elements form a composition of the superconductive alloy or an intermetallic compound. The sheets are subjected to a diameter reducing treatment as menetioned hereinafter and then to a heat treatment. The diffusion shielding coiled layer 6 is composed of Nb, Ta, V or Ti thin layers and the coils of the superconductive coiled layer 5 are positioned between the coils of layer 6 as illustrated; the stabilizing conductor coiled layer 7 is composed of Cu, Al or Ag thin layers, and the coils of layer 7 are positioned on either side of the coils of the above described diffusion shielding layer 6; and the insulating coiled layer 8 is composed of a material having a high resistance, such as a stainless steel or Ni, Nz, or Sn stainless steel or Ni, Zn or Sn thin layer, which forms an alloy intermediate layer having a high resistance in the boundary layer between the outer surface of the above described stabilizing conductor layer 7 and the surface of this thin layer.

Figure 2:
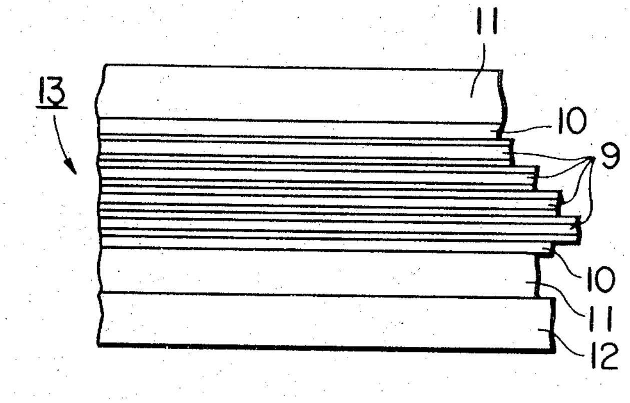
FIG. 2 is a cross-sectional view of a coiling material of combined metals to constitute the superconductive magnet.

The above described superconductive magnet is produced by the following novel process illustrated in FIG. 2.

Namely, the above described elements or alloys constituting the superconductive material, i.e. the composition of the superconductive alloy or intermetallic compound, are laminated, for example, in a particularly defined rate of thickness to form a superconductive composite sheet 9, and one or several of the composite sheets are put between two diffusion shielding thin sheets 10 and further put between two stabilizing metal thin sheets 11, and then on only one of these two thin sheets is superposed either a metal, alloy, or intermetallic compound sheet 12 having a high resistance or a metal thin sheet 12, which forms an alloy intermediate layer having a high resistance in the boundary layer between the outer surface of the stabilizing metal thin layer and the surface of this metal thin sheet 12 to form a combined coiing material a laminate 13, which is coiled to form a multilayer coil.

Figure 3:
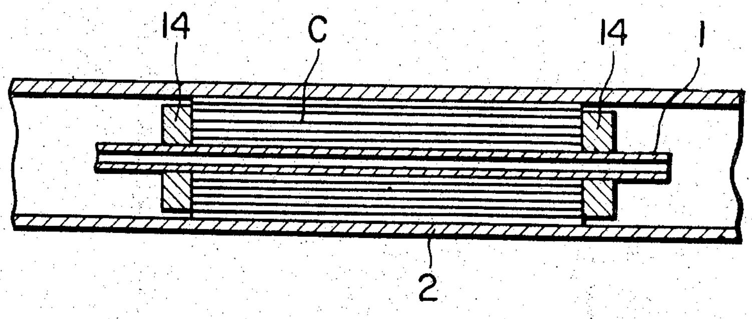
FIG. 3 is a sectional view showing a coiled body used in the manufacture of the superconductive magnet and prior to a diameter reducing treatment.

Into the inner and the outer sides of the thus formed coil *c* are inserted copper pipes 1 and 2, and both the ends of the coil *c* are fixed by retaining members 14, all as shown in FIG. 3. The resulting assembly is subjected to extrusion, drawing or treatment for extending the inner diameter of the inner copper pipe 1 and then heat-treated at a temperature of 600° C to 1,050° C to form the superconductive alloy or intermetallic compound in the superconductive core layer 5.

Figure 4A:
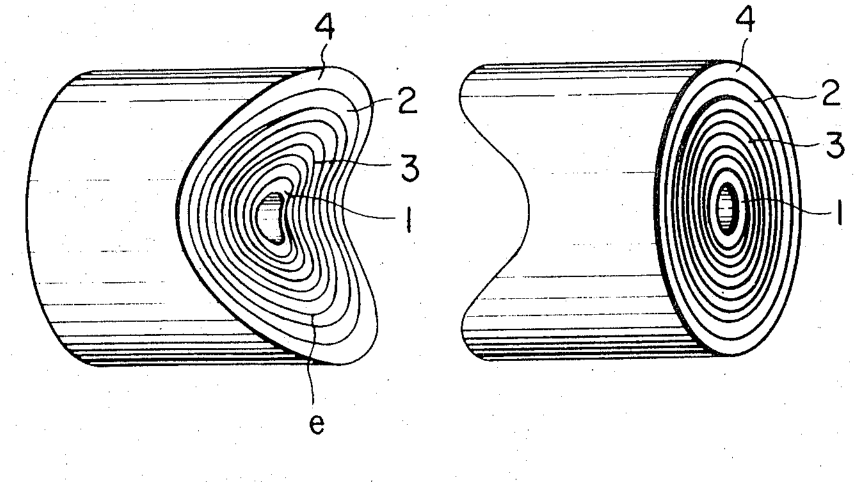
FIGS. 4*a* and *b* are perspective views of the superconductive magnets of the present invention.
Figure 4B:
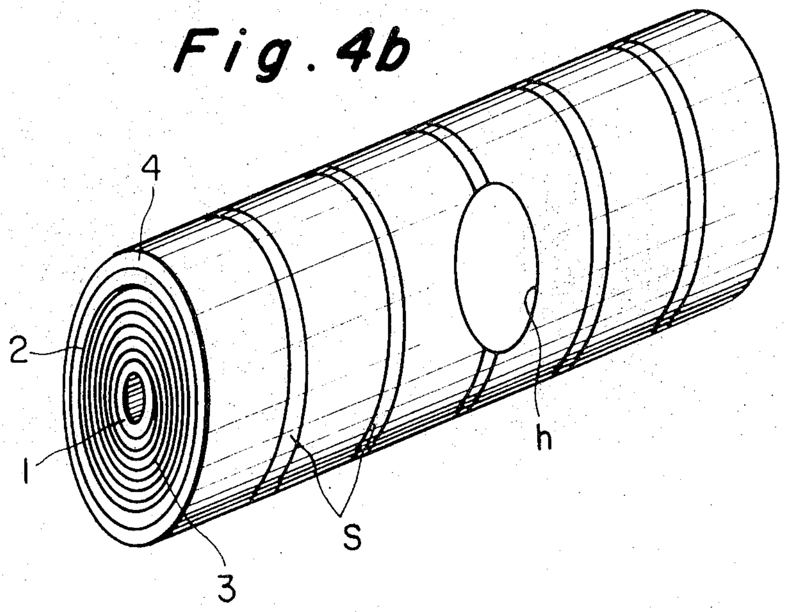

The thus formed cylindrical magnet is cut into a proper length to form pancake type of superconductive magnet, which is subjected to an end surface working *e* as shown in FIG. 4*a* or to a cutting working as shown in FIG. 4*b* to form a product.

Furthermore, when the expected current load is comparatively small, the superconductive insulating coiled layer 8 composed of the above described metal, alloy or intermetallic compound having high resistance can be omitted, and in this case the stabilizing conductor coiled layer 7 itself fulfills the function of the above described superconductive insulating layer.

In this case, when a part of the superconductive coiled layer 5 transfers to a normal conductive condition, a superconductive current by-passes a turn including said normal conductive part and flows to the next turn of the superconductive coiled layer 5, so that although the produced magnetic field decreases to a small extent by said by-passing, a stable operation can be still continued and the superconductive magnet can be used without danger.

Similarly, when the expected current load is comparatively small, the reinforcing outer case 4 can be omitted, and, further, when the diameter reducing working in which the inner diameter of the magnet is extended is not effected, a copper rod can be used in the place of the copper pipe as the inner sheath 1.

The following examples are given in illustration of this invention and are not intended as limitations thereof.

EXAMPLE 1

$Nb_3Sn$ superconductive magnet:

Annealed Nb sheet having a thickness of 0.53mm and Sn sheet having a thickness of 0.21mm were cleansed on the surfaces and then both the sheets were rolled and adhered after aligning the centers of breadth of both the sheets to form a clad metal having a thickness of 0.01mm. Eight sheets of this clad metal were piled up and on both the surfaces of the piled clad metals were superposed Nb sheets having a thickness of 0.01mm as shielding layers respectively, and then on the surface of each of the Nb sheets was superposed a copper sheet having a thickness of 0.03mm, and then on one copper sheet was superposed a stainless steel sheet having a thickness of 0.04mm to form a combined coiling material. The thus combined coiling material was convolved 140 turns tightly around an inner sheath of copper pipe having an inner diameter of 7mm and an outer diameter of 12mm so as to form the structure as shown in FIG. 1*b*. Then the resulting coil was urged from both the ends by two retaining members made of copper and having an inner diameter of 12mm, an outer diameter of 74mm and a thickness of 10mm to fix the position of the coil.

The thus convolved coil was inserted into an outer sheath of copper pipe, having an inner diameter of 76mm and an outer diameter of 86mm, which was extruded until the outer diameter of the outer sheath became 76mm and then subjected to a working for extending the inner diameter of the inner sheath to 10mm. The thus treated coiled body was inserted into a stainless steel pipe, having an inner diameter of 76.5mm and an outer diameter of 80mm and having a roughed inner surface, which was extruded until the outer diameter became 78mm.

Thereafter, the coiled body was wholly heat-treated at 800° C for 24 hours to cause a diffusion reaction between Nb layer and Sn layer resulting in formation of $Nb_3Sn$.

The cylindrical magnet material was cut into lengths of 10mm to obtain a pancake type of superconductive magnet.

These magnets were put one upon another through spacers having a thickness of 1mm, and they were connected in series electrically, and a current of 1,000A flowed therethrough at an extremely low temperature at which the superconductive phenomenon occurs, and the generated magnetic field was measured to obtain the result as shown in the following Table 1.

In the measurement of the magnetic field, the increase of bismuth electric resistance was utilized.

TABLE 1

| Number of magnets | Generated magnetic field K Oe |
|---|---|
| 1 | 40 |
| 2 | 75 |
| 3 | 100 |
| 4 | 105 |

EXAMPLE 2

$Nb_3Al_{0.8}Ge_{0.2}$ superconductive magnet:

Nb sheet of a thickness of 0.50mm and Al-20% Ge alloy sheet having a thickness of 0.16mm were cleansed on the surfaces and both the sheets were rolled and adhered to form 0.01mm clad metal. Three sheets of this clad metal were piled up, and Nb sheets of a thickness of 0.1mm were superposed on both the surfaces of the piled clad metal as shielding layers, and then copper sheets having a thickness of 0.03mm were further superposed on both the Nb sheets, and then on one copper sheet was superposed a stainless steel sheet having a thickness of 0.02mm. The thus combined coiled material was convolved 150 turns around a copper pipe having an inner diameter of 6mm and an outer diameter of 8mm, and the formed coil was urged from both the ends by two retaining members made of copper and having an inner diameter of 8mm, an outer diameter of 42mm and a thickness of 10mm, to fix the position of the coil. The coil was inserted into a copper pipe having an inner diameter of 45mm, an outer diameter of 53mm. The assembly was extruded into an outer diameter of 46mm and then subjected to a working for extending the inner diameter of the copper pipe. The thus treated coiled body was inserted into a stainless steel pipe, having an inner diameter of 53mm and an outer diameter of 57mm, which was extruded until the outer diameter became 55mm.

The thus treated coiled body was heat-treated at 1,000° C for 24 hours, and then the temperature was reduced and the coiled body was heat-treated at 800° C for 3 hours to form $Nb_3Al_{0.8}Ge_{0.2}$ as superconductive coiled layer.

The generated magnetic field of a pancake type of superconductive magnet cut to a length of 20mm was 55 K Oe when 1,000A of current was flowed.

EXAMPLE 3

$Nb_3Al$ superconductive magnet:

Nb sheet having a thickness of 0.53mm and Al sheet having a thickness of 0.14mm were annealed and cleansed on the surfaces and then both the sheets were rolled and adhered to form a clad metal of 0.01mm. Three sheets of this clad metal were piled up, and Nb sheets having a thickness of 0.01mm were superposed on both the surfaces of the piled clad metal as shielding layers, and further on the surfaces of the shielding layers were superposed composite sheets in which Ni sheet having a thickness of 0.01mm was interposed between two copper sheets having a thickness of 0.02mm respectively. The thus formed coiling material was convolved 252 turns around a copper rod having an outer diameter of 5mm. The resulting coil was urged from both the ends by two retaining members made of copper and having an inner diameter of 5mm, an outer diameter of 85mm and a thickness of 20mm, to fix the position of the coil. The coiled body was inserted into a copper pipe having an inner diameter of 92mm and an outer diameter of 100mm. The assembly was extruded until the outer diameter became 88mm. Then the coiled body was inserted into a stainless steel pipe, having a roughed inner surface and an inner diameter of 88mm and an outer diameter of 100mm, which was extruded until the outer diameter became 96mm.

Then the thus treated coiled body was heat-treated at 1,000° C for 48 hours and then cut into one piece having a length of 60mm and four pieces each having a length of 15mm. In the coiled body having a length of 60mm, a hole *h* having a diameter of 30mm was bored diametrically at the center of the longitudinal direction, and the coiled body was cut at the center of the longitudinal direction to obtain two pieces of 30mm. These pieces were put one upon another through spacers S having a thickness of 1mm as shown in FIG. 4*b* and were connected electrically in series, and 1,000A of current flowed therethrough, and a magnetic field of 80 K Oe was obtained at the center of the hole 30mm.

What is claimed is:

1. A method of producing a plurality of laminated, pancake type superconductive magnets, each magnet having a spirally coiled superconductive layer and a spirally coiled insulating layer therein, said method comprising the steps of:

1. forming a first laminate of at least two thin sheets of different material, which when heated in contact with each other, form a superconductive alloy or compound, said thin sheets being composed of a member selected from the grou consisting of Nb, Sn, Al, V, Zr, Ti, Pb, Ge and alloys thereof:
2. covering both sides of said first laminate with thin sheets composed of a diffusion shielding material selected from the group consisting of Nb, Ta, V and Ti to form a second laminate;
3. covering both sides of said second laminate with thin sheets composed of a conductive stabilizing material selected from the group consisting of Cu, Al and Ag to form a third laminate;
4. winding said third laminate around a tubing a plurality of times;
5. covering the resulting wound material with an outer sheathing;
6. reducing the diameter of the resulting assembly to form an elongated product;
7. subjecting the elongated product to a heat treatment at a temperature sufficient to form said superconductive alloy or compound, and
8. then cutting the elongated product into a plurality of very short lengths thereby producing said superconductive pancake type magnets.

2. The method of claim 1 wherein said tubing is composed of copper and wherein said outer sheathing comprises a copper tube.

3. The method of claim 2 further comprising, after step (3) and before step (4), covering only one side of said third laminate with a thin insulating layer composed of a member selected from the group consisting of stainless steel, Ni, Zn and Sn; wherein when the resulting laminate is wound around said tubing, said insulating layer is the outermost layer of said resulting laminate as said resulting laminate is wound around said tubing.

4. The method of claim 2 wherein said heat treatment is conducted at a temperature of from 600° to 1,050° C. for a sufficient period of time to form said superconductive alloy or compound.

5. The method of claim 2 further comprising covering the product produced in step (5) prior to step (6) with an outer reinforcing case of a material having a high mechanical strength.

6. The method of claim 5 wherein said outer reinforcing case is composed of stainless steel.

7. The method of claim 2 wherein said superconductive alloy form or compound is selected from the group consisting of $Nb_3Sn$, $Nb_3Al_{0.8}Ge_{0.2}$ or $Nb_3Al$.

* * * * *